(12) United States Patent
Hayami et al.

(10) Patent No.: US 6,686,855 B2
(45) Date of Patent: *Feb. 3, 2004

(54) COMPUTER PROGRAM FOR ENCODING DIGITAL DATA

(75) Inventors: Atsushi Hayami, Yokohama (JP); Toshio Kuroiwa, Yokohama (JP)

(73) Assignee: Victor Company of Japan, Ltd., Yokohama (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/400,500

(22) Filed: Mar. 28, 2003

(65) Prior Publication Data

US 2003/0184456 A1 Oct. 2, 2003

Related U.S. Application Data

(62) Division of application No. 10/270,537, filed on Oct. 16, 2002, now Pat. No. 6,577,255.

(30) Foreign Application Priority Data

Oct. 29, 2001 (JP) ........................................ 2001-330361
Dec. 28, 2001 (JP) ........................................ 2001-398679

(51) Int. Cl.[7] ................................................. H03M 7/00
(52) U.S. Cl. ............................. 341/59; 341/60; 341/61; 375/253
(58) Field of Search .......................... 341/59, 60, 61; 375/253

(56) References Cited

U.S. PATENT DOCUMENTS

| 5,140,474 A | | 8/1992 | Kahiman et al. |
| 5,600,315 A | * | 2/1997 | Shimpuku et al. ............. 341/59 |
| 5,742,243 A | * | 4/1998 | Moriyama .................... 341/59 |
| 5,952,944 A | | 9/1999 | Nonaka et al. |
| 6,172,622 B1 | | 1/2001 | Nakagawa et al. |
| 6,359,930 B1 | | 3/2002 | Nakagawa et al. |
| 6,496,541 B1 | * | 12/2002 | Kahiman et al. ............ 375/253 |
| 6,577,255 B2 | * | 6/2003 | Hayami et al. ................ 341/59 |

FOREIGN PATENT DOCUMENTS

| JP | 9-232963 | 9/1997 |
| JP | 11-346154 | 12/1999 |
| JP | 2000-068846 | 3/2000 |

* cited by examiner

*Primary Examiner*—Michael Tokar
*Assistant Examiner*—Lam Mai
(74) *Attorney, Agent, or Firm*—Louis Woo

(57) ABSTRACT

Encoding tables are accorded with variable-length encoding rules using a variable constraint length. A DSV control bit is periodically inserted into a first input bit stream to generate a second input bit stream. Every m-bit piece of the second input bit stream is encoded into an n-bit output signal forming at least a portion of an output code word by referring to the encoding tables. Thereby, the second input bit stream is converted into a first output bit stream composed of output code words and observing RLL (d, k). A sync word is inserted into the first output bit stream for every frame to generate a second output bit stream. A frame-end output code word is terminated at a position before a next-frame sync word. DSV control of the second output bit stream is implemented in response to the inserted DSV control bits.

4 Claims, 9 Drawing Sheets

| INPUT DATA | OUTPUT CODE WORD |
|---|---|
| 11 | *0* |
| 10 | 001 |
| 01 | 010 |
| 0011 | 010 100 |
| 0010 | 010 000 |
| 0001 | 000 100 |
| 000011 | 000 100 100 |
| 000010 | 000 100 000 |
| 000001 | 010 100 100 |
| 000000 | 010 100 000 |
| "110111 | 001 000 000 (next 010) |
| 00001000 | 000 100 100 100 |
| 00000000 | 010 100 100 100 | if xx1 then *0*=000
   xx0 then *0*=101

TERMINATION TABLE
| 00 | 000 |
|---|---|
| 0000 | 010 100 |

FIG. 4

| ID=0 Sk=0 | | | | ID=1 Sk=1 | | | |
|---|---|---|---|---|---|---|---|
| Dk | | Ck | Sk+1 | Dk | | Ck | Sk+1 |
| 01 | 2 | 010 | 0 | 01 | 2 | 010 | 0 |
| 10 | 1 | 001 | 1 | 10 | 1 | 001 | 1 |
| 11 | 5 | 101 | 1 | 11 | 0 | 000 | 0 |

FIG. 5

| ID=0 Sk=0 | | | | ID=1 Sk=1 | | | | ID=2 Sk=2 | | | |
|---|---|---|---|---|---|---|---|---|---|---|---|
| Dk | | Ck | Sk+1 | Dk | | Ck | Sk+1 | Dk | | Ck | Sk+1 |
| 01XX | 2 | 010 | 0 | 01XX | 2 | 010 | 0 | 01XX | 4 | 100 | 0 |
| 10XX | 1 | 001 | 1 | 10XX | 1 | 001 | 1 | 10XX | 0 | 000 | 0 |
| 11XX | 5 | 101 | 2 | 11XX | 0 | 000 | 2 | 11XX | 4 | 100 | 0 |
| 001X | 2 | 010 | 2 | 001X | 2 | 010 | 2 | 000X | 4 | 100 | 3 |
| 0001 | 0 | 000 | 2 | 0001 | 0 | 000 | 2 | 001X | 4 | 100 | 3 |

| Dk | Ck | Sk+1 |
|---|---|---|
| 01XXX | 2 010 | 0 |
| 10XXX | 1 001 | 1 |
| 11XXX | 5 101 | 1 |
| 001XX | 2 010 | 2 |
| 0001X | 0 000 | 2 |
| 00001 | 0 000 | 2 |
| 00000 | 2 010 | 2 |

ID=1, Sk=1

| Dk | Ck | Sk+1 |
|---|---|---|
| 01XXX | 2 010 | 0 |
| 10XXX | 1 001 | 1 |
| 11XXX | 0 000 | 0 |
| 001XX | 2 010 | 2 |
| 0001X | 0 000 | 2 |
| 00001 | 0 000 | 2 |
| 00000 | 2 010 | 2 |

ID=2, Sk=2

| Dk | Ck | Sk+1 |
|---|---|---|
| 01XXX | 4 100 | 0 |
| 10XXX | 0 000 | 0 |
| 11XXX | 4 100 | 0 |
| 000XX | 4 100 | 3 |
| 001XX | 4 100 | 3 |

ID=3, Sk=3

| Dk | Ck | Sk+1 |
|---|---|---|
| 0000X | 4 100 | 4 |
| 00XXX | 0 000 | 0 |
| 01XXX | 4 100 | 0 |
| 1000X | 4 100 | 4 |
| 10XXX | 0 000 | 0 |
| 11XXX | 4 100 | 0 |

FIG. 7

| | ID=0<br>Sk=0 | | |
|---|---|---|---|
| Dk | Ck | | Sk+1 |
| 01XXX | 2 | 010 | 0 |
| 10XXX | 1 | 001 | 1 |
| 11XXX | 5 | 101 | 1 |
| 001XX | 2 | 010 | 2 |
| 0001X | 0 | 000 | 2 |
| 00001 | 0 | 000 | 2 |
| 00000 | 2 | 010 | 2 |

| | ID=1<br>Sk=1 | | |
|---|---|---|---|
| Dk | Ck | | Sk+1 |
| 01XXX | 2 | 010 | 0 |
| 10XXX | 1 | 001 | 1 |
| 11XXX | 0 | 000 | 2 |
| 001XX | 2 | 010 | 2 |
| 0001X | 0 | 000 | 2 |
| 00001 | 0 | 000 | 2 |
| 00000 | 2 | 010 | 2 |

| | ID=2<br>Sk=2 | | |
|---|---|---|---|
| Dk | Ck | | Sk+1 |
| 01XXX | 4 | 100 | 0 |
| 10XXX | 0 | 000 | 0 |
| 11XXX | 4 | 100 | 0 |
| 000XX | 4 | 100 | 3 |
| 001XX | 4 | 100 | 3 |

| | ID=3<br>Sk=3 | | |
|---|---|---|---|
| Dk | Ck | | Sk+1 |
| 0000X | 4 | 100 | 4 |
| 00XXX | 0 | 000 | 0 |
| 01XXX | 4 | 100 | 0 |
| 1000X | 4 | 100 | 4 |
| 10XXX | 0 | 000 | 0 |
| 11XXX | 4 | 100 | 0 |

| | ID=4<br>Sk=4 | | |
|---|---|---|---|
| Dk | Ck | | Sk+1 |
| 00XXX | 4 | 100 | 0 |

FIG. 8

| Dk | ID=0, Sk=0 Ck | Sk+1 | Dk | ID=1, Sk=1 Ck | Sk+1 | Dk | ID=2, Sk=2 Ck | Sk+1 |
|---|---|---|---|---|---|---|---|---|
| 01XXXXXXXX | 2 010 | 0 | 01XXXXXXXX | 2 010 | 0 | 01XXXXXXXX | 4 100 | 0 |
| 10XXXXXXXX | 1 001 | 1 | 10XXXXXXXX | 1 001 | 1 | 11XXXXXXXX | 4 100 | 0 |
| 11011101XXX | 1 001 | 5 | 11011101XXX | 1 001 | 5 | 10XXXXXXXX | 0 000 | 0 |
| 11011101XX | 1 001 | 5 | 11011101XX | 1 001 | 5 | 001XXXXXXX | 4 100 | 3 |
| 11011100000 | 1 001 | 5 | 11011100000 | 1 001 | 5 | 000XXXXXXX | 4 100 | 3 |
| 11XXXXXXXX | 5 101 | 1 | 11XXXXXXXX | 0 000 | 0 | | | |
| 001XXXXXXX | 2 010 | 2 | 001XXXXXXX | 2 010 | 2 | | | |
| 0001XXXXXX | 0 000 | 2 | 0001XXXXXX | 0 000 | 2 | | | |
| 00000XXXXX | 2 010 | 2 | 00000XXXXX | 2 010 | 2 | | | |
| 00001XXXXX | 0 000 | 2 | 00001XXXXX | 0 000 | 2 | | | |

| Dk | ID=3, Sk=3 Ck | Sk+1 | Dk | ID=4, Sk=4 Ck | Sk+1 | Dk | ID=5, Sk=5 Ck | Sk+1 |
|---|---|---|---|---|---|---|---|---|
| 0000XXXXXX | 4 100 | 4 | 00XXXXXXXX | 4 100 | 0 | 01XXXXXXXX | 0 000 | 5 |
| 00XXXXXXXX | 0 000 | 0 | | | | 11XXXXXXXX | 0 000 | 0 |
| 01XXXXXXXX | 4 100 | 4 | | | | | | |
| 1000XXXXXX | 4 100 | 4 | | | | | | |
| 10XXXXXXXX | 0 000 | 0 | | | | | | |
| 11XXXXXXXX | 4 100 | 4 | | | | | | |

| SYNC | CODE WORD SEQUENCE | SYNC | CODE WORD SEQUENCE |

21, 22, 21, 22

SYNC FRAME

| TERMINATION TABLE |||
|---|---|---|
| Sk=5 |||
| Dk | Ck | Sk+1 |
| 00XXXXXXXX | 0 | 000 | X |
| 0000XXXXXX | 2 | 010 | 4 |

COMPUTER PROGRAM FOR ENCODING DIGITAL DATA

This application is a Division of Ser. No. 10/270,537 filed Oct. 16, 2002 now U.S. Pat. No. 6,577,255.

BACKGROUND OF THE INVENTION

1. Field of the Invention

This invention relates to a method of encoding digital data. In addition, this invention relates to an apparatus for encoding digital data. Furthermore, this invention relates to a recording medium.

2. Description of the Related Art

Some modulation (encoding) procedures used for digital signals recorded on recording mediums are of a RLL (d, k) type, where "RLL (d, k)" means run length limiting rules such that "d" to "k" successive bits of "0" should be between bits of "1" in a modulation-resultant bit stream.

Japanese patent application publication number 9-232963/1997 discloses an RLL (1, 7) modulation procedure for a digital signal. The modulation procedure in Japanese application 9-232963 includes a step of encoding a 2-bit or 4-bit input data piece into a 3-bit or 6-bit output code word by referring to conversion tables. The encoding is of the variable length type. The conversion tables are based on the following assignment of input data pieces to output code words.

| input data piece | output code word |
|---|---|
| 01 | x00 |
| 10 | 010 |
| 11 | x01 |
| 0001 | x00001 |
| 0010 | x00000 |
| 0011 | 010001 |
| 0000 | 010000 | where "x" notes an indefinite bit which is "0" when the last bit of an immediately-preceding output code word is "1", and which is "1" when the last bit of an immediately-preceding output code word is "0". The above-indicated 2-bit input data pieces correspond to a constraint length of "1", while the above-indicated 4-bit input data pieces correspond to a constraint length of "2".

The modulation procedure in Japanese application 9-232963 implements signal processing for indefinite bits, and executes a decision as to whether a current input data piece corresponds to a constraint length of "1" or "2". Therefore, an apparatus for carrying out the modulation procedure is complicated in structure.

Japanese patent application publication number 11-346154/1999 discloses an RLL (1, 7) modulation apparatus which includes an inserting section which adds DSV control bits to an input data sequence. The inserting section outputs the DSV-control-bit-added data to a modulator. The modulator handles the output data from the inserting section as data having a basic data length of 2 bits. According to conversion tables, the modulator converts the output data from the inserting section into data of a variable length code having a basic data length of 3 bits. The modulator outputs the variable-length-code data to an NRZI converter. The conversion tables have a replacement code for restricting succession of a minimum run to a prescribed number of times or less, and a replacement code for observing the run length limiting rules. The conversion tables further have a conversion rule such that the remainder in the division of the number of bits of "1" in each input element by 2 and the remainder in the division of the number of bits of "1" in a corresponding output element by 2 are equal to each other as 1 or 0. Thus, each input element and a corresponding output element are equal in polarity ("odd-even" in the number of bits of "1" in an element).

In Japanese application 11-346154, the modulator encodes a 2-bit, 4-bit, 6-bit, or 8-bit input data piece into a 3-bit, 6-bit, 9-bit, or 12-bit output code word by referring to the conversion tables. The encoding is of the variable length type. The conversion tables are based on the following assignment of input data pieces to output code words.

| input data piece | output code word |
|---|---|
| 11 | *0* |
| 10 | 001 |
| 01 | 010 |
| 0011 | 010 100 |
| 0010 | 010 000 |
| 0001 | 000 100 |
| 000011 | 000 100 100 |
| 000010 | 000 100 000 |
| 000001 | 010 100 100 |
| 000000 | 010 100 000 |
| "110111 | 001 000 000 (next 010) |
| 00001000 | 000 100 100 100 |
| 00000000 | 010 100 100 100 | if xx1 then *0* = 000
if xx0 then *0* = 101

The above-indicated 2-bit input data pieces correspond to a constraint length of "1". The above-indicated 4-bit input data pieces correspond to a constraint length of "2". The above-indicated 6-bit input data pieces correspond to a constraint length of "3". The above-indicated 8-bit input data pieces correspond to a constraint length of "4".

The modulation apparatus in Japanese application 11-346154 includes a portion for deciding which of constraint lengths a current input data piece corresponds to. Therefore, the modulation apparatus is complicated in structure.

SUMMARY OF THE INVENTION

It is a first object of this invention to provide a relatively simple method of encoding digital data.

It is a second object of this invention to provide a relatively simple apparatus for encoding digital data.

It is a third object of this invention to provide an improved recording medium.

A first aspect of this invention provides a method of encoding an input bit stream into a stream of output code words according to variable-length encoding rules using a variable constraint length, wherein a maximum value N of the constraint length is equal to or greater than 2, and the output-code-word stream observes prescribed run length limiting rules RLL (d, k), "d" and "k" denoting a predetermined minimum run length and a predetermined maximum run length respectively. The method comprises the steps of preparing M encoding tables in accordance with the variable-length encoding rules, M denoting a predetermined natural number equal to or greater than 2; periodically inserting a DSV control bit into a first input bit stream at intervals each corresponding to a prescribed number of successive bits in the first input bit stream to change the first input bit stream into a second input bit stream; encoding every m-bit piece of the second input bit stream into an n-bit output signal forming at least a portion of an output code word by referring to the M encoding tables, thereby converting the second input bit stream into a first output bit stream composed of output code words and observing the prescribed run length limiting rules RLL (d, k), "m" and "n" denoting predetermined natural numbers respectively; inserting a sync word of a predetermined bit pattern into the first output bit stream for every frame to change the first output bit stream into a second output bit stream; terminating a frame-end output code word at a position before a next-frame sync word; and implementing DSV control of the second output bit stream in response to the inserted DSV control bits.

A second aspect of this invention is based on the first aspect thereof, and provides a method wherein the M encoding tables register input bit patterns corresponding to the m-bit piece of the second input bit stream, n-bit output signals assigned to the input bit patterns respectively, and next-table selection numbers accompanying the n-bit output signals respectively and each designating one among the M encoding tables which will be used next; wherein the encoding step comprises encoding every m-bit piece of the second input bit stream into an n-bit output signal by referring to one of the M encoding tables which is designated by a current-table selection number being a next-table selection number provided by preceding encoding, and reading a next-table selection number accompanying the n-bit output signal from the designated one of the M encoding tables; and wherein the enabling step comprises using a termination table which registers at least one input bit pattern corresponding to the m-bit piece of the second input bit stream, at least one n-bit output signal assigned to the input bit pattern, and at least one next-table selection number accompanying the n-bit output signal and designating one among the M encoding tables which will be used next.

A third aspect of this invention is based on the first aspect thereof, and provides a method wherein the numbers "d" and "k" are equal to 1 and 7, respectively.

A fourth aspect of this invention provides an apparatus for encoding an input bit stream into a stream of output code words according to variable-length encoding rules using a variable constraint length, wherein a maximum value N of the constraint length is equal to or greater than 2, and the output-code-word stream observes prescribed run length limiting rules RLL (d, k), "d" and "k" denoting a predetermined minimum run length and a predetermined maximum run length respectively. The apparatus comprises M encoding tables accorded with the variable-length encoding rules, M denoting a predetermined natural number equal to or greater than 2, the M encoding tables registering input bit patterns corresponding to an m-bit piece of an input bit stream, n-bit output signals assigned to the input bit patterns respectively, and next-table selection numbers accompanying the n-bit output signals respectively and each designating one among the M encoding tables which will be used next; means for periodically inserting a DSV control bit into a first input bit stream at intervals each corresponding to a prescribed number of successive bits in the first input bit stream to change the first input bit stream into a second input bit stream; means for encoding every m-bit piece of the second input bit stream into an n-bit output signal forming at least a portion of an output code word by referring to one of the M encoding tables which is designated by a current-table selection number being a next-table selection number provided by preceding encoding, and reading a next-table selection number accompanying the n-bit output signal from the designated one of the M encoding tables, thereby converting the second input bit stream into a first output bit stream composed of output code words and observing the prescribed run length limiting rules RLL (d, k), "m" and "n" denoting predetermined natural numbers respectively; means for inserting a sync word of a predetermined bit pattern into the first output bit stream for every frame to change the first output bit stream into a second output bit stream; means for terminating a frame-end output code word at a position before a next-frame sync word; and means for implementing DSV control of the second output bit stream in response to the inserted DSV control bits.

A fifth aspect of this invention is based on the fourth aspect thereof, and provides an apparatus wherein the numbers "d" and "k" are equal to 1 and 7, respectively.

A sixth aspect of this invention provides a recording medium storing a second output bit stream generated from a first input bit stream by the method of the first aspect of this invention.

A seventh aspect of this invention is based on the second aspect thereof, and provides a method wherein the numbers "d" and "k" are equal to 1 and 7, respectively.

An eighth aspect of this invention provides a recording medium storing a second output bit stream generated from a first input bit stream by the method of the second aspect of this invention.

BRIEF DESCRIPTION OF THE DRAWINGS

FIG. 4 is a diagram of encoding tables relating to a constraint length of "1".

FIG. 5 is a diagram of encoding tables relating to constraint lengths of "1" and "2".

FIG. 6 is a diagram of encoding tables relating to constraint lengths of "1", "2", and "3".

FIG. 7 is a diagram of encoding tables relating to constraint lengths of "1", "2", "3", and "4".

FIG. 8 is a diagram of encoding tables being an extension of those in FIG. 7, and being able to handle an exceptional input data piece.

DETAILED DESCRIPTION OF THE INVENTION

First Embodiment

Figure 1:
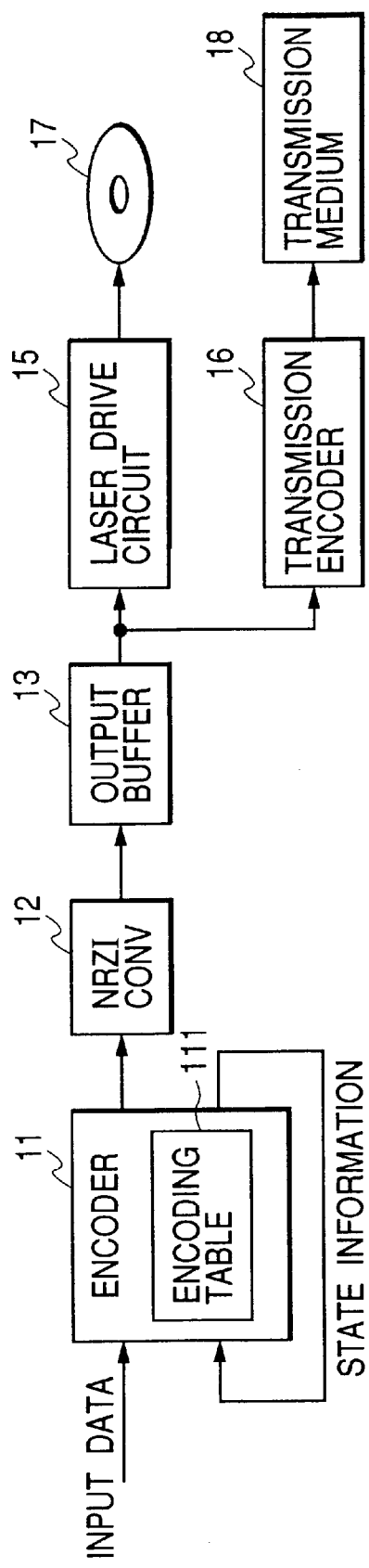
FIG. 1 is a block diagram of an encoding apparatus according to a first embodiment of this invention.

FIG. 1 shows an encoding apparatus according to a first embodiment of this invention. As shown in FIG. 1, the encoding apparatus includes an encoder 11, an NRZI (non-return-to-zero invert) converter 12, and an output buffer 13 which are sequentially connected in that order. The output buffer 13 is followed by a laser drive circuit 15 and a transmission encoder 16.

The encoder 11 may be formed by a digital signal processor, a CPU, or a similar device including a combination of an input/output port, a processing section, a ROM, and a RAM. In this case, the encoder 11 operates in accordance with a control program stored in the ROM or the RAM. The control program is designed to enable the encoder 11 to implement operation steps mentioned hereafter.

The encoder 11 receives input data (an input digital signal) in the form of, for example, a bit stream. The device 11 encodes the input data by referring to encoding tables 111. The encoding by the encoder 11 conforms to RLL (1, 7) which means prescribed run length limiting rules such that a minimum run is "1" and a maximum run is "7". Specifically, according to the encoding tables 111, the encoder 11 converts the 2 higher bits (the highest bit and the second highest bit) in every 11-bit piece of the input data into a corresponding 3-bit signal forming at least a portion of an output code word. Thereby, the encoder 11 changes the input data into a stream of output code words which follows RLL (1, 7). The output-code-word stream is also referred to as encoding-resultant data. The encoder 11 adds a sync word to the input data or the encoding-resultant data for every frame (sync frame). The sync word has a predetermined bit pattern. A given number of sync frames compose one recording sector. In addition, the encoder 11 may process the input data for DSV (digital sum variation) control.

The NRZI converter 12 receives the encoding-resultant data from the encoder 11. The NRZI converter 12 subjects the encoding-resultant data to NRZI modulation to generate modulation-resultant data of an NRZI code. The modulation-resultant data are sent from the NRZI converter 12 to at least one of the laser drive circuit 15 and the transmission encoder 16 via the output buffer 13. The laser drive circuit 15 records the modulation-resultant data on an optical disc 17 via an optical head. The optical disc 17 is an example of a recording medium. The laser drive circuit 15 may be replaced with a magnetic-head drive circuit. In this case, the magnetic-head drive circuit records the modulation-resultant data on a magnetic recording medium via a magnetic head. The transmission encoder 16 encodes the modulation-resultant data into data of a code suited for transmission. The transmission encoder 16 outputs the transmission-code data to a transmission medium 18. The transmission-code data propagate along the transmission medium 18.

Figures 2, 3:
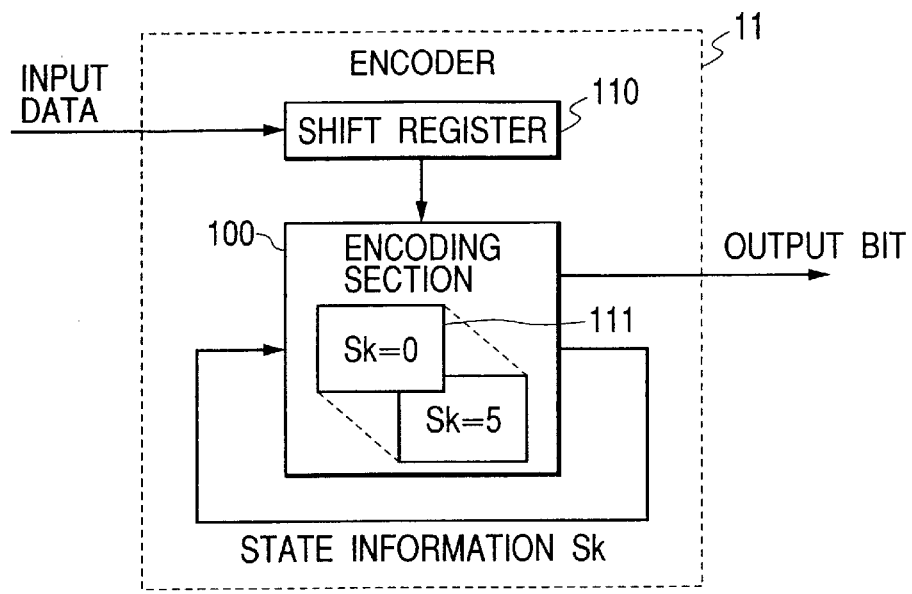
FIG. 2 is a block diagram of an encoder in FIG. 1.
FIG. 3 is a diagram of conversion rules deciding the relation between input data pieces and output code words.

As shown in FIG. 2, the encoder 11 includes an encoding section 100 and a shift register 110. The encoding section 100 has the encoding tables 111. The input data in the form of a bit stream are stored into the shift register 110, being transmitted through cells of the shift register 110. The shift register 110 is driven by a bit sync clock signal. Preferably, the shift register 100 implements a shift for every two bits. A given number of successive bits composing a current portion of the input data are held in the shift register 110, and are sent therefrom to the encoding section 100 as an input-data bit pattern.

The encoding tables 111 in the encoding section 100 are six encoding tables having identification (ID) numbers of "0", "1", "2", "3", "4", and "5" respectively. The encoding tables 111 register input signals (input bit patterns) Dk and 3-bit output signals Ck assigned to the input signals Dk respectively. The encoding tables 111 contain arrays of cells at different addresses respectively. Each of the cells has a set of a registered input signal (a registered input bit pattern) Dk, a 3-bit output signal Ck assigned to the registered input signal, and a state-information number Sk+1 accompanying the 3-bit output signal Ck. The state-information number Sk+1 designates one among the six encoding tables 111 which will be used next. Specifically, the state-information number Sk+1 is equal to the ID number of the encoding table which will be used next. The state-information number Sk+1 is also referred to as the next-table selection number Sk+1. A next-table selection number accompanying a 3-bit output signal Ck−1 immediately preceding the current 3-bit output signal Ck is defined as a current-table selection number Sk used for generation of the current 3-bit output signal Ck in response to a current input signal. The current-table selection number Sk is also referred to as the state-information number Sk.

The encoding section 100 receives the input-data bit pattern from the shift register 110. The encoding section 100 delays a signal representative of an adopted next-table selection number Sk+1 by a unit encoding time interval, thereby generating a signal representative of a current-table selection number Sk. The encoding section 100 feeds the signal of the current-table selection number Sk back thereto. The encoding section 100 selects one from the six encoding tables 111 which has an ID number equal to the current-table selection number (the state-information number) Sk. The encoding section 100 compares or collates the input-data bit pattern with bit patterns represented by input signals Dk registered in the selected encoding table. Thereby, the encoding section 100 detects one among the bit patterns represented by the registered input signals Dk which agrees with the input-data bit pattern. The encoding section 100 reads, from the selected encoding table, a 3-bit output signal Ck assigned to the registered input signal Dk representing the bit pattern agreeing with the input-data bit pattern, and also a signal representative of a next-table selection number (a state-information number) Sk+1 accompanying the 3-bit output signal Ck. The encoding section 100 feeds the 3-bit output signal to the NRZI converter 11. As previously mentioned, the encoding section 100 delays the signal representative of the next-table selection number Sk+1, and feeds the delay-resultant signal back thereto as a signal representative of a current-table selection number Sk.

The contents of the encoding tables 111 are based on RLL (1, 7) conversion rules shown in FIG. 3 which are the same as a main portion of those disclosed in Japanese patent application publication number 11-346154/1999. The encoding tables 111 can cover a termination portion of the conversion rules in Japanese application 11-346154. The conversion rules in FIG. 3 correspond to variable length encoding. It should be noted that the conversion rules in FIG. 3 may be replaced by other conversion rules.

The conversion rules in FIG. 3 contain basic output code words assigned to input bit patterns (input data pieces) "11" to "000000", replacement output code words assigned to input bit patterns "110111", "00001000", and "00000000", and termination output code words assigned to input bit patterns "00" and "0000". The basic output code words are indispensable to conversion. The replacement output code words enable conversion to be more efficient and effective although they are dispensable. The termination output code words are utilized in terminating an output-code-word sequence at an arbitrary position. The output code words in FIG. 3 are also referred to as the general output code words. It should be noted that the conversion rules in Japanese application 11-346154 prescribe sync signals.

The conversion rules in FIG. 3 conform to RLL (1, 7) where a minimum run is "1" and a maximum run is "7". The basic output code words in the conversion rules include indefinite one "*0*" assigned to the input bit pattern "11".

The indefinite output code word is set to either "000" or "101" so that a minimum run of "1" and a maximum run of "7" will be observed regardless of the states of immediately-preceding and immediately-following output code words. In the case where a current input data piece to be converted is "11" and the last bit of an immediately-preceding output code word is "1", an output code word of "000" is selected as current one to keep a minimum run of "1". On the other hand, in the case where a current input data piece to be converted is "11" and the last bit of an immediately-preceding output code word is "0", an output code word of "101" is selected as current one to keep a maximum run of "7".

According to the conversion rules in FIG. 3, in the case where a current input data piece to be converted is "110111", an immediately-following output code word is referred to. When the immediately-following output code word or an initial portion thereof is "010", an output code word of "001000000" is selected as current one. On the other hand, when the immediately-following output code word or an initial portion thereof differs from "010", the current input data piece "110111" is converted on a 2-bit by 2-bit basis ("11", "01", and "11") and is therefore changed into an output-code-word sequence of "*0*010*0*".

The conversion rules in FIG. 3 conform to RLL(1, 7), and provide an encoding rate of ⅔. According to the conversion rules in FIG. 3, each input data piece and a corresponding output code word are equal in polarity ("odd-even" in the number of bits of "1" in an element). The conversion rules in FIG. 3 can restrict a repetition of a minimum run of "1", that is, a repetition of a 2T portion in a record bit sequence, where "T" denotes the interval between bits composing the record bit sequence.

In the conversion rules of FIG. 3, the registered 2-bit input data pieces correspond to a constraint length of "1". The registered 4-bit input data pieces correspond to a constraint length of "2". The registered 6-bit input data pieces correspond to a constraint length of "3". The registered 8-bit input data pieces correspond to a constraint length of "4".

A portion of the conversion rules in FIG. 3 which relates to a constraint length of "1" is as follows.

| input data piece | output code word |
| --- | --- |
| 11 | *0* |
| 10 | 001 |
| 01 | 010 |

As previously mentioned, the indefinite output code word "*0*" is set to "000" when the last bit of an immediately-preceding output code word is "1", and is set to "101" when the last bit of an immediately-preceding output code word is "0".

FIG. 4 shows encoding tables having ID numbers of "0" and "1", and observing the portion of the conversion rules in FIG. 3 which relates to a constraint length of "1". The encoding table in FIG. 4 which has an ID number of "0" is used when the last bit of an immediately-preceding output code word is "0". On the other hand, the encoding table having an ID number of "1" is used when the last bit of an immediately-preceding output code word is "1". The encoding tables in FIG. 4 register 2-bit input data pieces (2-bit input bit patterns) Dk, and 3-bit output code words Ck assigned to the 2-bit input data pieces Dk respectively. The encoding tables have arrays of cells at different addresses respectively. Each of the cells has a set of a registered 2-bit input data piece (a registered input 2-bit pattern) Dk, a 3-bit output code word Ck assigned to the registered input data piece Dk, and a next-table selection number (a state information number) Sk+1 accompanying the output code word Ck. In FIG. 4, each input data piece (each input bit pattern) Dk is expressed by the binary notation while each output code word Ck is expressed by both the decimal notation and the binary notation. Each next-table selection number Sk+1 designates one among the encoding tables which will be used next. Specifically, the next-table selection number Sk+1 is equal to the ID number of the encoding table which will be used next. The next-table selection numbers Sk+1 are designed so that a stream of output code words will follow RLL (1, 7). A next-table selection number accompanying an output code word Ck−1 immediately preceding the current output code word Ck is defined as a current-table selection number Sk used for generation of the current output code word Ck in response to a current output data piece.

A portion of the conversion rules in FIG. 3 which relates to a constraint length of "2" is as follows.

| input data piece | output code word |
| --- | --- |
| 0011 | 010 100 |
| 0010 | 010 000 |
| 0001 | 000 100 |

There are three different output code words corresponding to a constraint length of "2". In the case of an input data piece "001x" ("x" denotes an indefinite bit), output-code-word bits of "010" are assigned to the former half "00" of the input data piece regardless of the state of the last bit of an immediately-preceding output code word. In the case of an input data piece "0001", output-code-word bits of "000" are assigned to the former half "00" of the input data piece regardless of the state of the last bit of an immediately-preceding output code word.

FIG. 5 shows encoding tables having ID numbers of "0", "1", and "2", and observing the portions of the conversion rules in FIG. 3 which relate to constraint lengths of "1" and "2". The encoding tables in FIG. 5 are an extension of those in FIG. 4. The encoding table in FIG. 5 which has an ID number of "2" is selected when an input data piece corresponds to a constraint length of "2". The encoding tables in FIG. 5 register input data pieces (input bit patterns) Dk, and 3-bit output code words Ck assigned to the input data pieces Dk respectively. The registered input data pieces Dk contain indefinite bits "x". The encoding tables have arrays of cells at different addresses respectively. Each of the cells has a set of a registered 4-bit input data piece (a registered input 4-bit pattern) Dk, a 3-bit output code word Ck assigned to the two former bits of the registered input data piece Dk, and a next-table selection number (a state information number) Sk+1 accompanying the output code word Ck. In FIG. 5, each input data piece (each input bit pattern) Dk is expressed by the binary notation while each output code word Ck is expressed by both the decimal notation and the binary notation. Each next-table selection number Sk+1 designates one among the encoding tables which will be used next. Specifically, the next-table selection number Sk+1 is equal to the ID number of the encoding table which will be used next. The next-table selection numbers Sk+1 are designed so that a stream of output code words will follow RLL (1, 7). A next-table selection number accompanying an output code word Ck−1 immediately preceding the current output code word Ck is defined as a current-table selection number Sk used for generation of the current output code word Ck in response to a current input data piece.

With reference to FIG. 5, in the case where the current-table selection number Sk is "0" and first and second input data pieces of "00" and "10" successively occur, the encoding table having an ID number of "0" (the encoding table having an ID number equal to the current-table selection number Sk) is selected. The first input data piece "00" disagrees with the two former bits of the registered input bit patterns "01xx", "10xx", and "11xx" in the selected encoding table. Therefore, both the first input data piece "00" and the second input data piece "10" are used in accessing the selected encoding table. The three former bits of the succession of the first input data piece "00" and the second input data piece "10" agree with the three former bits of the registered input bit pattern "001x" in the selected encoding table. Accordingly, an output code word Ck of "010" which is assigned to the registered input bit pattern "001x" is selected as a conversion result about the first input data piece "00". A next-table selection number Sk+1 of "2" accompanies the selected output code word "010".

Subsequently, the next-table selection number "2" is used as a current-table selection number Sk. Since the current-table selection number Sk is "2", the encoding table having an ID number of "2" is selected. The second input data piece "10" agrees with the two former bits of the registered input bit pattern "10xx" in the selected encoding table. Accordingly, an output code word Ck of "000" which is assigned to the registered input bit pattern "10xx" is selected as a conversion result about the second input data piece "10". A next-table selection number Sk+1 of "0" accompanies the selected output code word "000". Therefore, the encoding table having an ID number of "0" will be selected next.

A portion of the conversion rules in FIG. 3 which relates to a constraint length of "3" is as follows.

| input data piece | output code word |
|---|---|
| 000011 | 000 100 100 |
| 000010 | 000 100 000 |
| 000001 | 010 100 100 |
| 000000 | 010 100 000 |

There are four different output code words corresponding to a constraint length of "3".

FIG. 6 shows encoding tables having ID numbers of "0", "1", "2", and "3", and observing the portions of the conversion rules in FIG. 3 which relate to constraint lengths of "1", "2", and "3". The encoding tables in FIG. 6 are an extension of those in FIG. 5. The encoding table in FIG. 6 which has an ID number of "3" is selected when an input data piece corresponds to a constraint length of "3". The encoding tables in FIG. 6 register input data pieces (input bit patterns) Dk, and 3-bit output code words Ck assigned to the input data pieces Dk respectively. The registered input data pieces Dk contain indefinite bits "x". The encoding tables have arrays of cells at different addresses respectively. Each of the cells has a set of a registered 5-bit input data piece (a registered input 5-bit pattern) Dk, a 3-bit output code word Ck assigned to the two former bits of the registered input data piece Dk, and a next-table selection number (a state information number) Sk+1 accompanying the output code word Ck. In FIG. 6, each input data piece (each input bit pattern) Dk is expressed by the binary notation while each output code word Ck is expressed by both the decimal notation and the binary notation. Each next-table selection number Sk+1 designates one among the encoding tables which will be used next. Specifically, the next-table selection number Sk+1 is equal to the ID number of the encoding table which will be used next. The next-table selection numbers Sk+1 are designed so that a stream of output code words will follow RLL (1, 7). A next-table selection number accompanying an output code word Ck−1 immediately preceding the current output code word Ck is defined as a current-table selection number Sk used for generation of the current output code word Ck in response to a current input data piece.

With reference to FIG. 6, in the case where the current-table selection number Sk is "0" and first and second input data pieces of "00" and "000" successively occur, the encoding table having an ID number of "0" (the encoding table having an ID number equal to the current-table selection number Sk) is selected. The first input data piece "00" disagrees with the two former bits of the registered input bit patterns "01xxx", "10xxx", and "11xxx" in the selected encoding table. Therefore, both the first input data piece "00" and the second input data piece "000" are used in accessing the selected encoding table. The succession of the first input data piece "00" and the second input data piece "000" agrees with the registered input bit pattern "00000" in the selected encoding table. Accordingly, an output code word Ck of "010" which is assigned to the registered input bit pattern "00000" is selected as a conversion result about the first input data piece "00". A next-table selection number Sk+1 of "2" accompanies the selected output code word "010".

Subsequently, the next-table selection number "2" is used as a current-table selection number Sk. Since the current-table selection number Sk is "2", the encoding table having an ID number of "2" is selected. The second input data piece "000" agrees with the three former bits of the registered input bit pattern "000xx" in the selected encoding table. Accordingly, an output code word Ck of "100" which is assigned to the registered input bit pattern "000xx" is selected as a conversion result about the two former bits of the second input data piece "000". A next-table selection number Sk+1 of "3" accompanies the selected output code word "100".

Thereafter, the next-table selection number "3" is used as a current-table selection number Sk. Since the current-table selection number Sk is "3", the encoding table having an ID number of "3" is selected. It is assumed that the second input data piece "000" is followed by a third input data piece of "1". The succession of the last bit of the second input data piece "000" and the third input data piece "1" agrees with the two former bits of the registered input bit pattern "01xxx" in the selected encoding table. Accordingly, an output code word Ck of "100" which is assigned to the registered input bit pattern "01xxx" is selected as a conversion result about the last bit of the second input data piece "000" and the third input data piece "1". A next-table selection number Sk+1 of "0" accompanies the selected output code word "100". Therefore, the encoding table having an ID number of "0" will be selected next.

As understood from the above description, the encoding tables in FIG. 6 convert an input bit sequence of "000001" into an output bit sequence of "010100100". This conversion is accorded with the conversion rules in FIG. 3.

With reference to FIG. 6, in the case where the current-table selection number Sk is "0" and first and second input data pieces of "00" and "001" successively occur, the encoding table having an ID number of "0" (the encoding table having an ID number equal to the current-table selection number Sk) is selected. The first input data piece "00" disagrees with the two former bits of the registered input bit patterns "01xxx", "10xxx", and "11xxx" in the selected encoding table. Therefore, both the first input data piece "00" and the second input data piece "001" are used in accessing the selected encoding table. The succession of the first input data piece "00" and the second input data piece "001" agrees with the registered input bit pattern "00001" in the selected encoding table. Accordingly, an output code word Ck of "000" which is assigned to the registered input bit pattern "00001" is selected as a conversion result about the first input data piece "00". A next-table selection number Sk+1 of "2" accompanies the selected output code word "000".

Subsequently, the next-table selection number "2" is used as a current-table selection number Sk. Since the current-table selection number Sk is "2", the encoding table having an ID number of "2" is selected. The second input data piece "001" agrees with the three former bits of the registered input bit pattern "001xx" in the selected encoding table. Accordingly, an output code word Ck of "100" which is assigned to the registered input bit pattern "001xx" is selected as a conversion result about the two former bits of the second input data piece "001". A next-table selection number Sk+1 of "3" accompanies the selected output code word "100".

Thereafter, the next-table selection number "3" is used as a current-table selection number Sk. Since the current-table selection number Sk is "3", the encoding table having an ID number of "3" is selected. It is assumed that the second input data piece "001" is followed by a third input data piece of "0". The succession of the last bit of the second input data piece "001" and the third input data piece "0" agrees with the two former bits of the registered input bit pattern "10xxx" in the selected encoding table. Accordingly, an output code word Ck of "000" which is assigned to the registered input bit pattern "10xxx" is selected as a conversion result about the last bit of the second input data piece "001" and the third input data piece "0". A next-table selection number Sk+1 of "0" accompanies the selected output code word "000". Therefore, the encoding table having an ID number of "0" will be selected next.

As understood from the above description, the encoding tables in FIG. 6 convert an input bit sequence of "000010" into an output bit sequence of "000100000". This conversion is accorded with the conversion rules in FIG. 3.

Regarding each of the encoding tables in FIG. 6, an input-data bit pattern is sequentially compared or collated with the registered input bit patterns (the registered input data pieces) in the encoding table in the order from the uppermost cell toward the lowermost cell. In the encoding table having an ID number of "3", the cell containing the registered input bit pattern "0000x" is located above that containing the registered input bit pattern "00xxx". Therefore, the comparison of the input-data bit pattern with the registered input bit pattern "0000x" precedes the comparison of the input-data bit pattern with the registered input bit pattern "00xxx". In the encoding table having an ID number of "3", the cell containing the registered input bit pattern "1000x" is located above that containing the registered input bit pattern "10xxx". Therefore, the comparison of the input-data bit pattern with the registered input bit pattern "1000x" precedes the comparison of the input-data bit pattern with the registered input bit pattern "10xxx".

A portion of the conversion rules in FIG. 3 which relates to a constraint length of "4" is as follows.

| input data piece | output code word |
|---|---|
| 00001000 | 000 100 100 100 |
| 00000000 | 010 100 100 100 |

There are two different output code words corresponding to a constraint length of "4".

FIG. 7 shows encoding tables having ID numbers of "0", "1", "2", "3", and "4", and observing the portions of the conversion rules in FIG. 3 which relate to constraint lengths of "1", "2", "3", and "4". The encoding tables in FIG. 7 are an extension of those in FIG. 6. The encoding table in FIG. 7 which has an ID number of "4" is selected when an input data piece corresponds to a constraint length of "4". The encoding tables in FIG. 7 register input data pieces (input bit patterns) Dk, and 3-bit output code words Ck assigned to the input data pieces Dk respectively. The registered input data pieces Dk contain indefinite bits "x". The encoding tables have arrays of cells at different addresses respectively. Each of the cells has a set of a registered 5-bit input data piece (a registered input 5-bit pattern) Dk, a 3-bit output code word Ck assigned to the two former bits of the registered input data piece Dk, and a next-table selection number (a state information number) Sk+1 accompanying the output code word Ck. In FIG. 7, each input data piece (an input bit pattern) Dk is expressed by the binary notation while each output code word Ck is expressed by both the decimal notation and the binary notation. Each next-table selection number Sk+1 designates one among the encoding tables which will be used next. Specifically, the next-table selection number Sk+1 is equal to the ID number of the encoding table which will be used next. The next-table selection numbers Sk+1 are designed so that a stream of output code words will follow RLL (1, 7). A next-table selection number accompanying an output code word Ck−1 immediately preceding the current output code word Ck is defined as a current-table selection number Sk used for generation of the current output code word Ck in response to a current input data piece.

With reference to FIG. 7, in the case where the current-table selection number Sk is "0" and an input data piece of "00001000" occurs, that is, in the case where the current-table selection number Sk is "0" and first, second, and third input data pieces of "00", "001", and "000" successively occur, the encoding table having an ID number of "0" (the encoding table having an ID number equal to the current-table selection number Sk) is selected. The first input data piece "00" disagrees with the two former bits of the registered input bit patterns "01xxx", "10xxx", and "11xxx" in the selected encoding table. Therefore, both the first input data piece "00" and the second input data piece "001" are used in accessing the selected encoding table. The succession of the first input data piece "00" and the second input data piece "001" agrees with the registered input bit pattern "00001" in the selected encoding table. Accordingly, an output code word Ck of "000" which is assigned to the registered input bit pattern "00001" is selected as a conversion result about the first input data piece "00". A next-table selection number Sk+1 of "2" accompanies the selected output code word "000".

Subsequently, the next-table selection number "2" is used as a current-table selection number Sk. Since the current-table selection number Sk is "2", the encoding table having an ID number of "2" is selected. The second input data piece "001" agrees with the three former bits of the registered input bit pattern "001xx" in the selected encoding table. Accordingly, an output code word Ck of "100" which is assigned to the registered input bit pattern "001xx" is selected as a conversion result about the two former bits of the second input data piece "001". A next-table selection number Sk+1 of "3" accompanies the selected output code word "100".

Thereafter, the next-table selection number "3" is used as a current-table selection number Sk. Since the current-table selection number Sk is "3", the encoding table having an ID number of "3" is selected. The succession of the last bit of the second input data piece "001" and the third input data piece "000" agrees with the four former bits of the registered input bit pattern "1000x" in the selected encoding table. Accordingly, an output code word Ck of "100" which is assigned to the registered input bit pattern "1000x" is selected as a conversion result about the last bit of the second input data piece "001" and the first bit of the third input data piece "000". A next-table selection number Sk+1 of "4" accompanies the selected output code word "100".

Subsequently, the next-table selection number "4" is used as a current-table selection number Sk. Since the current-table selection number Sk is "4", the encoding table having an ID number of "4" is selected. The two later bits of the third input data piece "000" agrees with the two former bits of the registered input bit pattern "00xxx" in the selected encoding table. Accordingly, an output code word Ck of "100" which is assigned to the registered input bit pattern "00xxx" is selected as a conversion result about the two later bits of the third input data piece "000". A next-table selection number Sk+1 of "0" accompanies the selected output code word "100". Therefore, the encoding table having an ID number of "0" will be selected next.

As understood from the above description, the encoding tables in FIG. 7 convert an input bit sequence of "00001000" into an output bit sequence of "000100100100". This conversion is accorded with the conversion rules in FIG. 3.

The encoding tables in FIG. 7 are extended into encoding tables in FIG. 8 which can handle an exceptional input data piece of "10111". The encoding tables in FIG. 8 have ID-numbers of "0", "1", "2", "3", "4", and "5", and observe the conversion rules in FIG. 3. The encoding tables in FIG. 8 register input data pieces (input bit patterns) Dk, and 3-bit output code words Ck assigned to the input data pieces Dk respectively. The registered input data pieces Dk contain indefinite bits "x". The encoding tables have arrays of cells at different addresses respectively. Each of the cells has a set of a registered 11-bit input data piece (a registered input 11-bit pattern) Dk, a 3-bit output code word Ck assigned to the two former bits of the registered input data piece Dk, and a next-table selection number (a state information number) Sk+1 accompanying the output code word Ck. In FIG. 8, each input data piece (each input bit pattern) Dk is expressed by the binary notation while each output code word Ck is expressed by both the decimal notation and the binary notation. Each next-table selection number Sk+1 designates one among the encoding tables which will be used next. Specifically, the next-table selection number Sk+1 is equal to the ID number of the encoding table which will be used next. The next-table selection numbers Sk+1 are designed so that a stream of output code words will follow RLL (1, 7). A next-table selection number accompanying an output code word Ck−1 immediately preceding the current output code word Ck is defined as a current-table selection number Sk used for generation of the current output code word Ck in response to a current input data piece.

With reference to FIG. 8, in the case where the current-table selection number Sk is "0" and an input data piece of "11011100000" occurs, the encoding table having an ID number of "0" (the encoding table having an ID number equal to the current-table selection number Sk) is selected. The input data piece "11011100000" agrees with the registered input bit pattern "11011100000" in the selected encoding table. Accordingly, an output code word Ck of "001" which is assigned to the registered input bit pattern "11011100000" is selected as a conversion result about the first and second bits of the input data piece "11011100000". A next-table selection number Sk+1 of "5" accompanies the selected output code word "001".

Subsequently, the next-table selection number "5" is used as a current-table selection number Sk. Since the current-table selection number Sk is "5", the encoding table having an ID number of "5" is selected. The third and fourth bits of the input data piece "11011100000" agree with the two former bits of the registered input bit pattern "01xxxxxxxxx" in the selected encoding table. Accordingly, an output code word Ck of "000" which is assigned to the registered input bit pattern "01xxxxxxxxx" is selected as a conversion result about the third and fourth bits of the input data piece "11011100000". A next-table selection number Sk+1 of "5" accompanies the selected output code word "000".

Thereafter, the next-table selection number "5" is used as a current-table selection number Sk. Since the current-table selection number Sk is "5", the encoding table having an ID number of "5" is selected. The fifth and sixth bits of the input data piece "11011100000" agree with the two former bits of the registered input bit pattern "11xxxxxxxxx" in the selected encoding table. Accordingly, an output code word Ck of "000" which is assigned to the registered input bit pattern "11xxxxxxxxx" is selected as a conversion result about the fifth and sixth bits of the input data piece "11011100000". A next-table selection number Sk+1 of "0" accompanies the selected output code word "000".

Subsequently, the next-table selection number "0" is used as a current-table selection number Sk. Since the current-table selection number Sk is "0", the encoding table having an ID number of "0" is selected. The seventh to last bits of the input data piece "11011100000" agree with the five former bits of the registered input bit pattern "00000xxxxxx" in the selected encoding table. Accordingly, an output code word Ck of "010" which is assigned to the registered input bit pattern "00000xxxxxx" is selected as a conversion result about the seventh and eighth bits of the input data piece "11011100000". A next-table selection number Sk+1 of "2" accompanies the selected output code word "010".

Thereafter, the next-table selection number "2" is used as a current-table selection number Sk. Since the current-table selection number Sk is "2", the encoding table having an ID number of "2" is selected. The ninth to last bits of the input data piece "11011100000" agree with the three former bits of the registered input bit pattern "000xxxxxxxx" in the selected encoding table. Accordingly, an output code word Ck of "100" which is assigned to the registered input bit pattern "000xxxxxxxx" is selected as a conversion result about the ninth and tenth bits of the input data piece "11011100000". A next-table selection number Sk+1 of "3" accompanies the selected output code word "100".

Subsequently, the next-table selection number "3" is used as a current-table selection number Sk. Since the current-table selection number Sk is "3", the encoding table having an ID number of "3" is selected. It is assumed that the input data piece "11011100000" is followed by a second input data piece of "0". The succession of the last bit of the input data piece "11011100000" and the second input data piece "0" agrees with the two former bits of the registered input bit pattern "00xxxxxxxxx" in the selected encoding table. Accordingly, an output code word Ck of "000" which is assigned to the registered input bit pattern "00xxxxxxxxx" is selected as a conversion result about the last bit of the input data piece "11011100000" and the second input data piece "0". A next-table selection number Sk+1 of "0" accompanies the selected output code word "000". Therefore, the encoding table having an ID number of "0" will be selected next.

As understood from the above description, the encoding tables in FIG. 8 convert an exceptional input bit sequence of "110111" into an output bit sequence of "001000000" provided that a next output bit sequence is "010". This conversion is accorded with the conversion rules in FIG. 3.

With reference back to FIGS. 1 and 2, the encoding tables 111 use the six encoding tables in FIG. 8. The shift register 110 is of the 11-bit type. The input data are propagated through the shift register 110 while bits composing a portion of the input data are periodically shifted therein on a 2-bit by 2-bit basis. Specifically, the shift register 110 periodically samples and holds 11 successive bits of the input data. The shift register 110 outputs the sampled and held 11 bits to the encoding section 100 as an input-data bit pattern. The encoding section 100 selects one from the six encoding tables 111 in response to the current-table selection number Sk, and accesses the selected encoding table in response to the 11-bit input-data bit pattern and thereby converts the 2 higher bits (the highest bit and the second highest bit) in the 11-bit input-data bit pattern into a corresponding 3-bit output code word. The encoding section 100 outputs a signal representative of a next-table selection number (a state-information number) Sk+1 which accompanies the 3-bit output code word. The next-table selection number Sk+1 designates one among the six encoding tables 111 which will be used next.

In this way, the encoding section 100 generates a 3-bit output code word (a fixed-length output code word) for the 2 higher bits in every 11-bit input-data piece from the shift register 110 by referring to one of the six encoding tables 111 which is designated by the current-table selection number Sk. Furthermore, the encoding section 100 outputs a signal representative of a next-table selection number Sk+1 which accompanies the generated 3-bit output code word. The next-table selection number Sk+1 designates one among the six encoding tables 111 which will be used in generating a next 3-bit output code word for the 2 higher bits in a next 11-bit input-data piece from the shift register 110. Accordingly, the input data are handled as a stream of 2-bit pieces, and the 2-bit input-data pieces are converted into 3-bit output code words respectively. Thus, the input data (the sequence of the 2-bit pieces) are encoded into a stream of the 3-bit output code words. This encoding is similar to fixed-length block encoding although a constraint length related to the input data is variable as shown in FIG. 3. The encoding section 100 feeds the stream of the 3-bit output code words to the NRZI converter 12 as the encoding-resultant data. The 3-bit output code words composing the encoding-resultant data are ones of the registered 3-bit output code words in the six encoding tables 111. In some cases, one of the 3-bit output code words forms a 3-bit output code word in FIG. 3. In other cases, two, three, or four of the 3-bit output code words are connected to form a 6-bit, 9-bit, or 12-bit output code word in FIG. 3. Therefore, the 3-bit output code words composing the encoding-resultant data form at least portions of the general output code words in FIG. 3 which are classified according to constraint length.

Figures 9, 10:
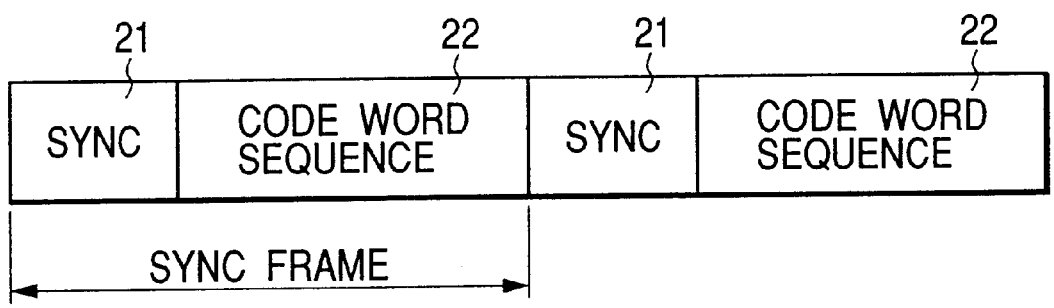
FIG. 9 is a time-domain diagram of a stream of sync frames outputted from the encoder in FIG. 1, and each composed of a sync word and an output-code-word sequence following the sync word.
FIG. 10 is a diagram of a termination table.

As previously mentioned, the encoder 11 adds a sync word to the input data or the encoding-resultant data for every frame (sync frame). Thus, as shown in FIG. 9, the encoding-resultant data outputted from the encoder 11 are formed by a stream of sync frames each composed of a sync word 21 and an output-code-word sequence 22 following the sync word 21. The encoder 11 implements termination processing which terminates an output code word at the end of every sync frame. In other words, the termination processing terminates a frame-end output code word at a position before a next-frame sync word 21. Accordingly, the termination processing prevents one output code word from occupying portions of two neighboring sync frames which would cause a difficulty in decoding the encoding-resultant data.

The encoder 11 includes a termination table in FIG. 10. As previously mentioned, the encoder 11 periodically executes the encoding of the input data on a 2-bit by 2-bit basis. Two bits composing a portion of the input data are referred to as a symbol. The termination processing by the encoder 11 is designed so that the last symbol "00" in an input data piece or a sync word will be converted into an output code word of "000", and the last two symbols "0000" in an input data piece or a sync word will be converted into an output code word of "010100".

The termination table in FIG. 10 registers 11-bit input data pieces (input 11-bit patterns) Dk, and 3-bit output code words Ck assigned to the 11-bit input data pieces Dk respectively. The termination table has two cells at different addresses respectively. Each of the cells has a set of a registered 11-bit input data piece (a registered input 11-bit pattern) Dk, a 3-bit output code word Ck assigned to the two former bits of the registered input data piece Dk, and a next-table selection number (a state information number) Sk+1 accompanying the output code word Ck. In FIG. 10, each input data piece (each input bit pattern) Dk is expressed by the binary notation while each output code word Ck is expressed by both the decimal notation and the binary notation. Each next-table selection number Sk+1 designates one among the encoding tables which will be used next. Specifically, the next-table selection number Sk+1 is equal to the ID number of the encoding table which will be used next. The next-table selection numbers Sk+1 are designed so that a stream of output code words will follow RLL (1, 7). A next-table selection number accompanying an output code word Ck−1 immediately preceding the current output code word Ck is defined as a current-table selection number Sk used for generation of the current output code word Ck in response to a current input data piece. In FIG. 10, "Sk+1=x" means that the setting of a next-table selection number Sk+1 is unnecessary.

Regarding the termination table in FIG. 10, an input-data bit pattern is sequentially compared or collated with the registered input bit patterns (the registered input data pieces) in the termination table in the order from the uppermost cell toward the lowermost cell. According to the termination table in FIG. 10, the encoder 11 generates an output bit sequence of "000" when an input bit sequence ends at "00". Specifically, the encoder 11 decides that the input data piece "00" agrees with the two former bits of the registered input bit pattern "00xxxxxxxxx" in the termination table. The encoder 11 reads, from the termination table, an output code word Ck of "000" which is assigned to the registered input bit pattern "00xxxxxxxxx". Thus, the encoder 11 generates an output bit sequence of "000". A next-table selection number Sk+1=x accompanies the output code word "000". Therefore, the encoder 11 does not set a next-table selection number Sk+1.

According to the termination table in FIG. 10, the encoder 11 generates an output bit sequence of "010100" when an input bit sequence ends at "0000". Specifically, the encoder 11 decides that the input data piece "0000" agrees with the four former bits of the registered input bit pattern "0000xxxxxxx" in the termination table. The encoder 11 reads, from the termination table, an output code word Ck of "010" which is assigned to the registered input bit pattern "0000xxxxxxx". Thus, the encoder 11 generates an output bit sequence of "010". A next-table selection number Sk+1 of "4" accompanies the output code word "010". Subsequently, the next-table selection number "4" is used as a current-table selection number Sk. Since the current-table selection number Sk is "4", the encoding table in FIG. 8 which has an ID number of "4" is selected. The encoder 11 decides that the third and fourth bits in the input data piece "0000" agree with the two former bits of the registered input bit pattern "00xxxxxxxxx" in the selected encoding table. The encoder 11 reads, from the selected encoding table, an output code word Ck of "100" which is assigned to the registered input bit pattern "00xxxxxxxxx". Thus, the encoder 11 generates an output bit sequence of "100". As a result, the encoder 11 generates an output bit sequence of "010100".

The encoder 11 executes the termination processing when the encoding responsive to a constraint length is completed and an input data piece "00" or "0000" occurs as a symbol or symbols. Therefore, the execution of the termination processing is limited to cases where the encoding is responsive to a current-table selection number Sk of "0" or "1". In other cases, the termination processing is unnecessary, and the encoding is based on the encoding tables in FIG. 8.

As previously mentioned, the encoder 11 may be formed by a digital signal processor, a CPU, or a similar device including a combination of an input/output port, a processing section, a ROM, and a RAM. In this case, the encoder 11 operates in accordance with a control program stored in the ROM or the RAM.

Figure 11:
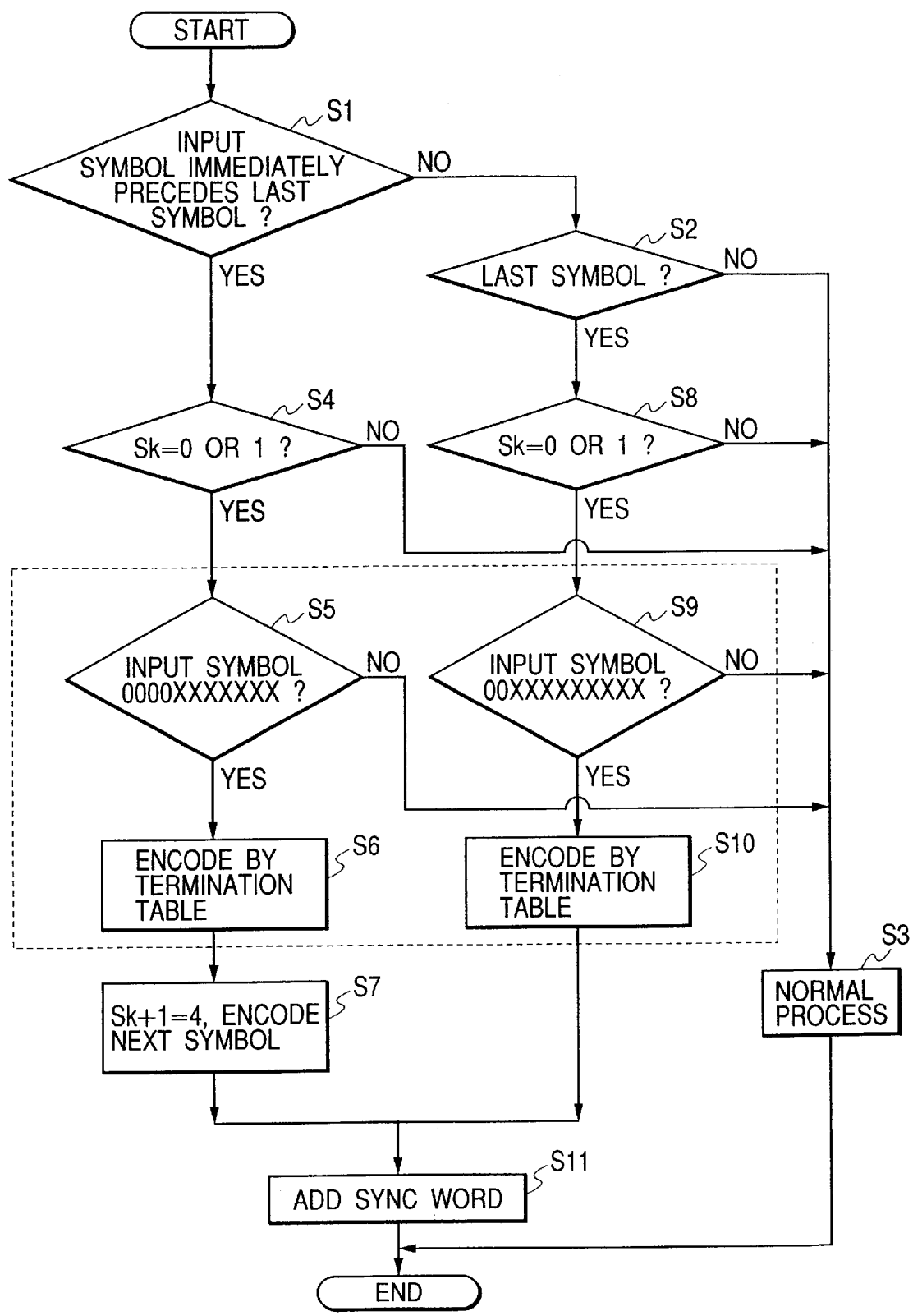
FIG. 11 is a flowchart of a termination-processing segment of a control program for the encoder in FIG. 1.

FIG. 11 is a flowchart of a termination-processing segment of the control program for the encoder 11 which is executed basically for every input symbol (every symbol of the input data). As shown in FIG. 11, a first step S1 of the program segment decides whether or not a current input symbol immediately precedes a last symbol in a frame. When the current input symbol immediately precedes the last symbol in the frame, the program advances from the step S1 to a step S4. Otherwise, the program advances from the step S1 to a step S2.

The step S2 decides whether or not the current input symbol is the last symbol in the frame. When the current input symbol is the last symbol in the frame, the program advances from the step S2 to a step S8. Otherwise, the program advances from the step S2 to a step S3.

The step S4 decides whether or not the current-table selection number Sk is one of "0" and "1". When the current-table selection number Sk is "0" or "1", the program advances from the step S4 to a step S5. Otherwise, the program advances from the step S4 to the step S3.

The step S5 decides whether or not the succession of the current input symbol and a next input symbol agrees with the four former bits of a bit pattern of "0000xxxxxxx" which is registered in the termination table in FIG. 10. When the succession of the current input symbol and the next input symbol agrees with the four former bits of the bit pattern "0000xxxxxxx", the program advances from the step S5 to a step S6. Otherwise, the program advances from the step S5 to the step S3.

The step S6 encodes the current input symbol "00" into an output code word Ck of "010" by referring to the termination table in FIG. 10. The step S6 gets, from the termination table, a next-table selection number Sk+1 of "4" which accompanies the output code word "010".

A step S7 following the step S6 uses the next-table selection number "4" as a current-table selection number Sk. The step S7 selects one from the encoding tables in FIG. 8 which has an ID number equal to the current-table selection number Sk. Thus, the encoding table having an ID number of "4" is selected. The step S7 encodes the next input symbol "00" into an output code word Ck of "100" by referring to the selected encoding table. Thus, the steps S6 and S7 generate an output bit sequence of "010100". After the step S7, the program advances to a step S11.

The step S8 decides whether or not the current-table selection number Sk is one of "0" and "1". When the current-table selection number Sk is "0" or "1", the program advances from the step S8 to a step S9. Otherwise, the program advances from the step S8 to the step S3.

The step S9 decides whether or not the current input symbol agrees with the two former bits of a bit pattern of "00xxxxxxxxx" which is registered in the termination table in FIG. 10. When the current input symbol agrees with the two former bits of the bit pattern "00xxxxxxxxx", the program advances from the step S9 to a step S10. Otherwise, the program advances from the step S9 to the step S3.

The step S10 encodes the current input symbol "00" into an output code word Ck of "000" by referring to the termination table in FIG. 10. Thus, the step S10 generates an output bit sequence of "000". After the step S10, the program advances to the step S11.

The step S3 encodes the current input symbol in the normal way using the encoding tables in FIG. 8. After the step S3, the current execution cycle of the program segment ends.

The step S11 adds a sync word to encoding-resultant data. After the step S11, the current execution cycle of the program segment ends.

As understood from the above description, the steps S5, S6, S9, and S10 use the termination table in FIG. 10.

The encoder 11 in FIGS. 1 and 2 implements the encoding of the input data without deciding a constraint length of each of pieces composing the input data. The encoding of the input data uses the encoding tables 111, and resembles fixed-length encoding. Accordingly, the encoding of the input data is efficient and simple. The encoder 11 implements the termination processing which terminates an output code word at the end of every sync frame. The termination processing is based on the termination table similar in structure to the encoding tables 111. For the implementation of the termination processing, it is unnecessary to decide a constraint length of every input-data piece.

Second Embodiment

Figure 12:
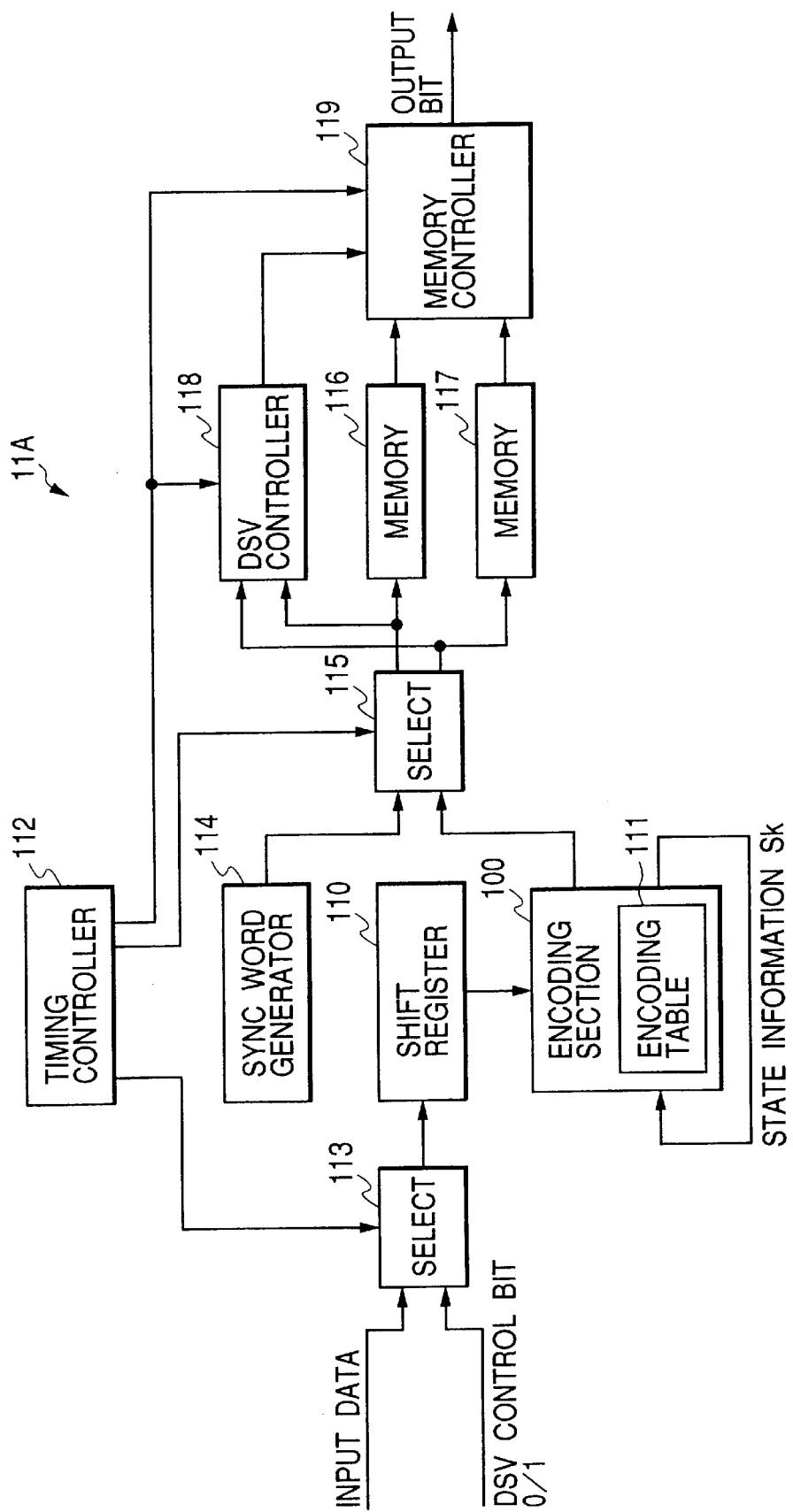
FIG. 12 is a block diagram of an encoder in a second embodiment of this invention.

FIG. 12 shows an encoder 11A in a second embodiment of this invention. The encoder 11A may replace the encoder 11 in the encoding apparatus of FIG. 1. As shown in FIG. 12, the encoder 11A includes an encoding section 100 and a shift register 110 which are similar to those in the encoder 11 (see FIG. 2).

The encoder 11A further includes a timing controller 112 and a selector 113. The selector 113 receives input data. The selector 113 receives a signal of "0" and a signal of "1" as a DSV control bit of "0" and a DSV control bit of "1" respectively. The timing controller 112 is driven by a master clock signal which uses a bit sync clock signal. The timing controller 112 generates a first control signal in response to the master clock signal. The timing controller 112 feeds the first control signal to the selector 113. The device 113 selects the input data or the DSV control bit "0" in response to the first control signal, and passes the selected input data or the selected DSV control bit "0" to the shift register 110. The first control signal is designed so that the DSV control bit "0" will be periodically inserted into the input data at intervals each corresponding to a prescribed number of bits in the input data. Thus, the selector 113 converts the input data into the DSV-0-added input data, and outputs the DSV-0-added input data to the shift register 110. Similarly, the device 113 selects the input data or the DSV control bit "1" in response to the first control signal, and passes the selected input data or the selected DSV control bit "1" to the shift register 110. Thus, the selector 113 converts the input data into the DSV-1-added input data, and outputs the DSV-1-added input data to the shift register 110.

The shift register 110 has first and second 11-bit banks for the DSV-0-added input data and the DSV-1-added input data respectively. The first and second banks are driven by the bit sync clock signal. The DSV-0-added input data are stored into the first bank of the shift register 110, being transmitted through cells of the first bank of the shift register 110. Eleven successive bits composing a current portion of the DSV-0-added input data are held in the first bank of the shift register 110, and are sent therefrom to the encoding section 100 as a DSV-0 input-data bit pattern. Similarly, the DSV-1-added input data are stored into the second bank of the shift register 110, being transmitted through cells of the second bank of the shift register 110. Eleven successive bits composing a current portion of the DSV-1-added input data are held in the second bank of the shift register 110, and are sent therefrom to the encoding section 100 as a DSV-1 input-data bit pattern.

The encoding section 100 alternately processes the DSV-0 input-data bit pattern and the DSV-1 input-data bit pattern on a time sharing basis. The encoding section 100 has encoding tables 111. According to the encoding tables 111, the encoding section 100 converts the 2 higher bits (the highest bit and the second highest bit) in every DSV-0 input-data bit pattern into a corresponding 3-bit signal forming at least a portion of an output code word. Thereby, the encoding section 100 and the shift register 110 change the DSV-0-added input data into a DSV-0 stream of output code words which follows RLL (1, 7). The DSV-0 output-code-word stream is also referred to as DSV-0 encoding-resultant data. The encoding section 100 and the shift register 110 implement the previously-mentioned termination processing on the DSV-0-added input data. The encoding section 100 outputs the DSV-0 encoding-resultant data to a selector 115.

Similarly, the encoding section 100 converts the 2 higher bits (the highest bit and the second highest bit) in every DSV-1 input-data bit pattern into a corresponding 3-bit signal forming at least a portion of an output code word. Thereby, the encoding section 100 and the shift register 110 change the DSV-1-added input data into a DSV-1 stream of output code words which follows RLL (1, 7). The DSV-1 output-code-word stream is also referred to as DSV-1 encoding-resultant data. The encoding section 100 and the shift register 110 implement the previously-mentioned termination processing on the DSV-1-added input data. The encoding section 100 outputs the DSV-1 encoding-resultant data to the selector 115.

A sync word generator 114 outputs a sync word of a predetermined bit pattern to the selector 115. The timing controller 112 generates a second control signal in response to the master clock signal. The timing controller 112 feeds the second control signal to the selector 115. The device 115 selects the DSV-0 encoding-resultant data or the sync word in response to the second control signal, and passes the selected DSV-0 encoding-resultant data or the selected sync word to a memory 116 and a DSV calculator 118. The second control signal is designed so that the sync word will be periodically inserted into the DSV-0 encoding-resultant data. Thus, the selector 115 converts the DSV-0 encoding-resultant data into the DSV-0 sync-added data, and outputs the DSV-0 sync-added data to the memory 116 and the DSV calculator 118. Similarly, the device 115 selects the DSV-1 encoding-resultant data or the sync word in response to the second control signal, and passes the selected DSV-1 encoding-resultant data or the selected sync word to a memory 117 and the DSV calculator 118. Thus, the selector 115 converts the DSV-1 encoding-resultant data into the DSV-1 sync-added data, and outputs the DSV-1 sync-added data to the memory 117 and the DSV calculator 118.

The memory 116 stores a current output code word forming a latest part of the DSV-0 sync-added data. Previous output code words are also in the memory 116. On the other hand, the memory 117 stores a current output code word forming a latest part of the DSV-1 sync-added data. Previous output code words are also in the memory 117.

The timing controller 112 generates a third control signal in response to the master clock signal. The timing controller 112 feeds the third control signal to the DSV controller 118 and a memory controller 119.

The DSV calculator 118 responds to the third control signal from the timing controller 112. The DSV calculator 118 refers to the current output code word forming the latest part of the DSV-0 sync-added data. The DSV calculator 118 computes the absolute DSV value of the current output code word and previous output code words in the memory 116 which is referred to as the first absolute DSV value. The DSV calculator 118 refers to the current output code word forming the latest part of the DSV-1 sync-added data. The DSV calculator 118 computes the absolute DSV value of the current output code word and previous output code words in the memory 117 which is referred to as the second absolute DSV value. The DSV calculator 118 compares the computed first absolute DSV value and the computed second absolute DSV value to decide which of the two is smaller. The DSV calculator 118 informs the memory controller 119 of the result of the comparison.

The memory controller 119 responds to the comparison result notified by the DSV calculator 118. In the case where the comparison result indicates that the first absolute DSV value is equal to or smaller than the second absolute DSV value, the memory controller 119 replaces the current output code word in the memory 117 with the current output code word in the memory 116 while keeping unchanged the current output code word in the memory 116. On the other hand, in the case where the comparison result indicates that the first absolute DSV value is greater than the second absolute DSV value, the memory controller 119 replaces the current output code word in the memory 116 with the current output code word in the memory 117 while keeping unchanged the current output code word in the memory 117.

At a final stage, the memory controller 119 operates as follows. When the comparison result indicates that the first absolute DSV value is equal to or smaller than the second absolute DSV value, the memory controller 119 transfers a stream of the output code words from the memory 116 to the NRZI circuit 12 (see FIG. 1) in synchronism with the third control signal fed from the timing controller 112. On the other hand, when the comparison result indicates that the first absolute DSV value is greater than the second absolute DSV value, the memory controller 119 transfers a stream of the output code words from the memory 117 to the NRZI circuit 12 (see FIG. 1) in synchronism with the third control signal fed from the timing controller 112.

In this way, the encoder 11A implements the encoding of the input data while executing the DSV control. It is unnecessary for the encoder 11A to decide a constraint length of each of pieces composing the input data. The encoding of the input data uses the encoding tables 111, and resembles fixed-length encoding. Accordingly, the encoding of the input data is efficient and simple. The encoder 11A implements the termination processing which terminates an output code word at the end of every sync frame. The termination processing is based on the termination table similar in structure to the encoding tables 111. For the implementation of the termination processing, it is unnecessary to decide a constraint length of every input-data piece.

Third Embodiment

A third embodiment of this invention is similar to the first or second embodiment thereof except for design changes mentioned hereafter. The third embodiment of this invention includes "M" encoding tables, where "M" denotes a predetermined natural number equal to or greater than 2. According to the "M" encoding tables, every m-bit piece of input data is encoded into an n-bit output code word, where "m" and "n" denote predetermined natural numbers. Thus, the input data are encoded into a stream of n-bit output code words. This encoding resembles fixed-length block encoding. Generally, the number "n" is greater than the number "m". Ones or more of n-bit output code words form general output code words classified according to constraint length. A sync word is periodically inserted into the output-code-word stream to generate a sync-added output-code-word stream. Termination processing is implemented to terminate a general output code word at the end of every sync frame. In addition, DSV control is implemented for the sync-added output-code-word stream.

The "M" encoding tables are similar to those used by fixed-length block encoding. The input data are subjected to variable-length encoding which uses the "M" encoding tables. Furthermore, the sync addition, the termination processing, and the DSV control are implemented. Final output data which result from the variable-length encoding, the sync addition, the termination processing, and the DSV control observe RLL (d, k), where "d" and "k" denote predetermined natural numbers. The number "d" is smaller than the number "k".

Fourth Embodiment

A fourth embodiment of this invention is similar to the first or second embodiment thereof except for design changes mentioned hereafter.

In the fourth embodiment of this invention, an input bit stream is encoded into a stream of output code words according to variable-length encoding rules using a variable constraint length. A maximum value N of the constraint length is equal to or greater than 2. The output-code-word stream observes prescribed run length limiting rules RLL (d, k), where "d" and "k" denote a predetermined minimum run length and a predetermined maximum run length respectively.

There are M encoding tables accorded with the variable-length encoding rules, where M denotes a predetermined natural number equal to or greater than 2. A DSV control bit is periodically inserted into a first input bit stream at intervals each corresponding to a prescribed number of successive bits in the first input bit stream to change the first input bit stream into a second input bit stream. Every m-bit piece of the second input bit stream is encoded into an n-bit output signal forming at least a portion of an output code word by referring to the M encoding tables, where "m" and "n" denote predetermined natural numbers respectively. Thereby, the second input bit stream is converted into a first output bit stream composed of output code words and observing the prescribed run length limiting rules RLL (d, k). A sync word of a predetermined bit pattern is inserted into the first output bit stream for every frame to change the first output bit stream into a second output bit stream. A frame-end output code word is terminated at a position before a next-frame sync word. DSV control of the second output bit stream is implemented in response to the inserted DSV control bits.

The M encoding tables register input bit patterns corresponding to the m-bit piece of the second input bit stream, n-bit output signals assigned to the input bit patterns respectively, and next-table selection numbers accompanying the n-bit output signals respectively and each designating one among the M encoding tables which will be used next. Every m-bit piece of the second input bit stream is encoded into an n-bit output signal by referring to one of the M encoding tables which is designated by a current-table selection number being a next-table selection number provided by preceding encoding. A next-table selection number accompanying the n-bit output signal is read from the designated one of the M encoding tables.

The termination of a frame-end output code word at a position before a next-frame sync word is executed by referring to a termination table. The termination table registers at least one input bit pattern corresponding to the m-bit piece of the second input bit stream, at least one n-bit output signal assigned to the input bit pattern, and at least one next-table selection number accompanying the n-bit output signal and designating one among the M encoding tables which will be used next.

What is claimed is:

1. A computer program stored in an information recording medium for enabling a computer to implement a method of encoding an input bit stream into a stream of output code words according to variable-length encoding rules using a variable constraint length, wherein a maximum value N of the constraint length is equal to or greater than 2, and the output-code-word stream observes prescribed run length limiting rules RLL (d, k), "d" and "k" denoting a predetermined minimum run length and a predetermined maximum run length respectively, the method comprising the steps of:

preparing M encoding tables in accordance with the variable length encoding rules, M denoting a predetermined natural number equal to or greater than 2;

periodically inserting a DSV control bit into a first input bit stream at intervals each corresponding to a prescribed number of successive bits in the first input bit stream to change the first input bit stream into a second input bit stream;

encoding every m-bit piece of the second input bit stream into an n-bit output signal forming at least a portion of an output code word by referring to the M encoding tables, thereby converting the second input bit stream into a first output bit stream composed of output code words and observing the prescribed run length limiting rules RLL (d, k), "m" and "n" denoting predetermined natural numbers respectively;

inserting a sync word of a predetermined bit pattern into the first output bit stream for every frame to change the first output bit stream into a second output bit stream;

terminating a frame-end output code word at a position before a next-frame sync word; and implementing DSV control of the second output bit stream in response to the inserted DSV control bits.

2. A computer program as recited in claim 1, wherein the M encoding tables register input bit patterns corresponding to the m-bit piece of the second input bit stream, n-bit output signals assigned to the input bit patterns respectively, and next-table selection numbers accompanying the n-bit output signals respectively and each designating one among the M encoding tables which will be used next; wherein the encoding step comprises encoding every m-bit piece of the second input bit stream into an n-bit output signal by referring to one of the M encoding tables which is designated by a current-table selection number being a next-table selection number provided by preceding encoding, and reading a next-table selection number accompanying the n-bit output signal from the designated one of the M encoding tables; and wherein the terminating step comprises using a termination table which registers at least one input bit pattern corresponding to the m-bit piece of the second input bit stream, at least one n-bit output signal assigned to the input bit pattern, and at least one next-table selection number accompanying the n-bit output signal and designating one among the M encoding tables which will be used next.

3. A computer program as recited in claim 1, wherein the numbers "d" and "k" are equal to 1 and 7, respectively.

4. A computer program as recited in claim 2, wherein the numbers "d" and "k" are equal to 1 and 7, respectively.

* * * * *